United States Patent
Yang et al.

(10) Patent No.: US 11,024,637 B2
(45) Date of Patent: Jun. 1, 2021

(54) EMBEDDED NON-VOLATILE MEMORY

(71) Applicant: TAIWAN SEMICONDUCTOR MANUFACTURING CO., LTD., Hsinchu (TW)

(72) Inventors: Tsung-Yu Yang, Tainan (TW); Chung-Jen Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 8 days.

(21) Appl. No.: 16/271,968

(22) Filed: Feb. 11, 2019

(65) Prior Publication Data

US 2019/0189624 A1 Jun. 20, 2019

Related U.S. Application Data

(63) Continuation of application No. 15/420,232, filed on Jan. 31, 2017, now Pat. No. 10,204,917.

(60) Provisional application No. 62/431,519, filed on Dec. 8, 2016.

(51) Int. Cl.
| | |
|---|---|
| *H01L 27/1157* | (2017.01) |
| *H01L 29/66* | (2006.01) |
| *H01L 21/3213* | (2006.01) |
| *H01L 21/768* | (2006.01) |
| *H01L 29/423* | (2006.01) |
| *H01L 21/28* | (2006.01) |

(Continued)

(52) U.S. Cl.
CPC .... *H01L 27/1157* (2013.01); *H01L 21/32133* (2013.01); *H01L 21/76895* (2013.01); *H01L 27/11573* (2013.01); *H01L 29/40117* (2019.08); *H01L 29/42344* (2013.01); *H01L 29/66553* (2013.01); *H01L 29/66833* (2013.01); *H01L 29/792* (2013.01)

(58) Field of Classification Search
None
See application file for complete search history.

(56) References Cited

U.S. PATENT DOCUMENTS

| 8,541,277 B2 | 9/2013 | Jeong | |
|---|---|---|---|
| 2005/0176202 A1* | 8/2005 | Hisamoto | ............. H01L 27/115 438/257 |
| 2006/0091470 A1 | 5/2006 | Noguchi et al. | |

(Continued)

*Primary Examiner* — Michelle Mandala
(74) *Attorney, Agent, or Firm* — McClure, Qualey & Rodack, LLP

(57) ABSTRACT

A semiconductor device includes a semiconductor substrate and a pair of memory device structures. The semiconductor substrate includes a common source/drain region and a pair of individual source/drain regions, in which the common source/drain region is between the individual source/drain regions. The memory device structures each corresponds to one of the individual source/drain regions. Each memory device structure includes a trap storage structure, a control gate, a cap structure, and a word line. The trap storage structure is between the common source/drain region and the corresponding individual source/drain region. The control gate is over the trap storage structure. The cap structure is over the control gate, in which the cap structure comprises a nitride layer over the control gate and an oxide layer over the nitride layer. The word line is over the semiconductor substrate and laterally spaced from the control gate.

20 Claims, 15 Drawing Sheets

(51) Int. Cl.
*H01L 29/792* (2006.01)
*H01L 27/11573* (2017.01)

(56) References Cited

U.S. PATENT DOCUMENTS

| | | |
|---|---|---|
| 2007/0218631 A1 | 9/2007 | Prinz et al. |
| 2015/0060983 A1 | 3/2015 | Lusetsky et al. |
| 2015/0091079 A1 | 4/2015 | Perera et al. |
| 2016/0064082 A1 | 3/2016 | Hong et al. |

* cited by examiner

EMBEDDED NON-VOLATILE MEMORY

PRIORITY CLAIM AND CROSS-REFERENCE

This application is a continuation of U.S. non-provisional patent application Ser. No. 15/420,232 filed on Jan. 31, 2017, now U.S. Pat. No. 10,204,917 issued on Feb. 12, 2019, which claims priority to U.S. provisional application Ser. No. 62/431,519 filed on Dec. 8, 2016, all of which are herein incorporated by reference in their entirety.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

Super-flash technology has enabled designers to create cost effective and high performance programmable SOC (system on chip) solutions through the use of split-gate flash memory cells. The aggressive scaling of 1.5 T memory enables designing flash memories with very high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
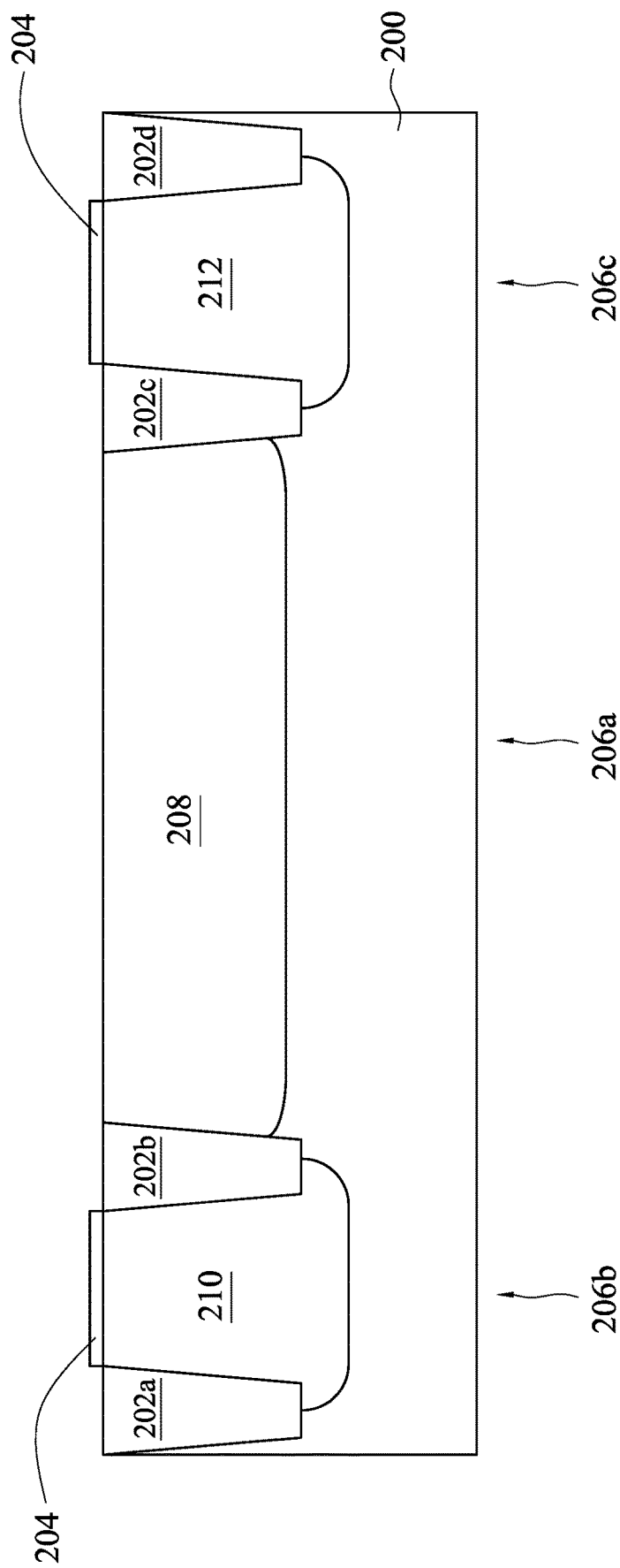
FIG. 1A through FIG. 1N are schematic cross-sectional views of intermediate stages showing a method for manufacturing a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a gate structure of a typical 1.5 T memory, a floating gate is used as a trap storage for charge trapping. The floating gate is formed from polysilicon. For the electrical requirement, the floating gate formed from polysilicon is required to have a sufficient thickness. Furthermore, the gate structure further includes an isolation structure between the floating gate and a control gate over the floating gate to separate the floating gate and the control gate. Thus, the gate structure has a higher stack topology, and thus subsequent patterning processes of the memory are difficult, resulting in a complex process integration and high process cost.

Embodiments of the present disclosure are directed to providing a method for manufacturing the semiconductor device, in which an oxide/nitride/oxide (ONO) structure may be used as a trap storage structure of a gate structure of each device structure in the semiconductor device, and a process of forming a gate oxide layer of a high voltage device can be integrated with a process of forming the device structures easily. Thus, a process for forming the semiconductor device including an ONO trap storage structure can be simplified. In addition, the ONO trap storage structure is thinner than the polysilicon floating gate, such that the thickness of the gate structure is reduced. Furthermore, the control gate can be directly disposed on the ONO trap storage structure, and the gate structure only use the top oxide layer of the ONO trap storage structure as an isolation layer to separate a control gate from the silicon nitride trap storage of the ONO structure, such that the thickness of the gate structure is further reduced. Thus, compared to the gate structure of the conventional memory, the gate structure has a lower structure topology which is close to that of the logic gate, such that the subsequent patterning processes of the semiconductor device are relatively easy, thereby further simplifying a process for manufacturing the semiconductor device and integration of the processes of the semiconductor device and other device, and decreasing process time and reducing process cost. Moreover, a low voltage well of the semiconductor device is protected by a stacked structure during a flash process, such that a low voltage device can be prevented from extra thermal budget.

Figure 1B:
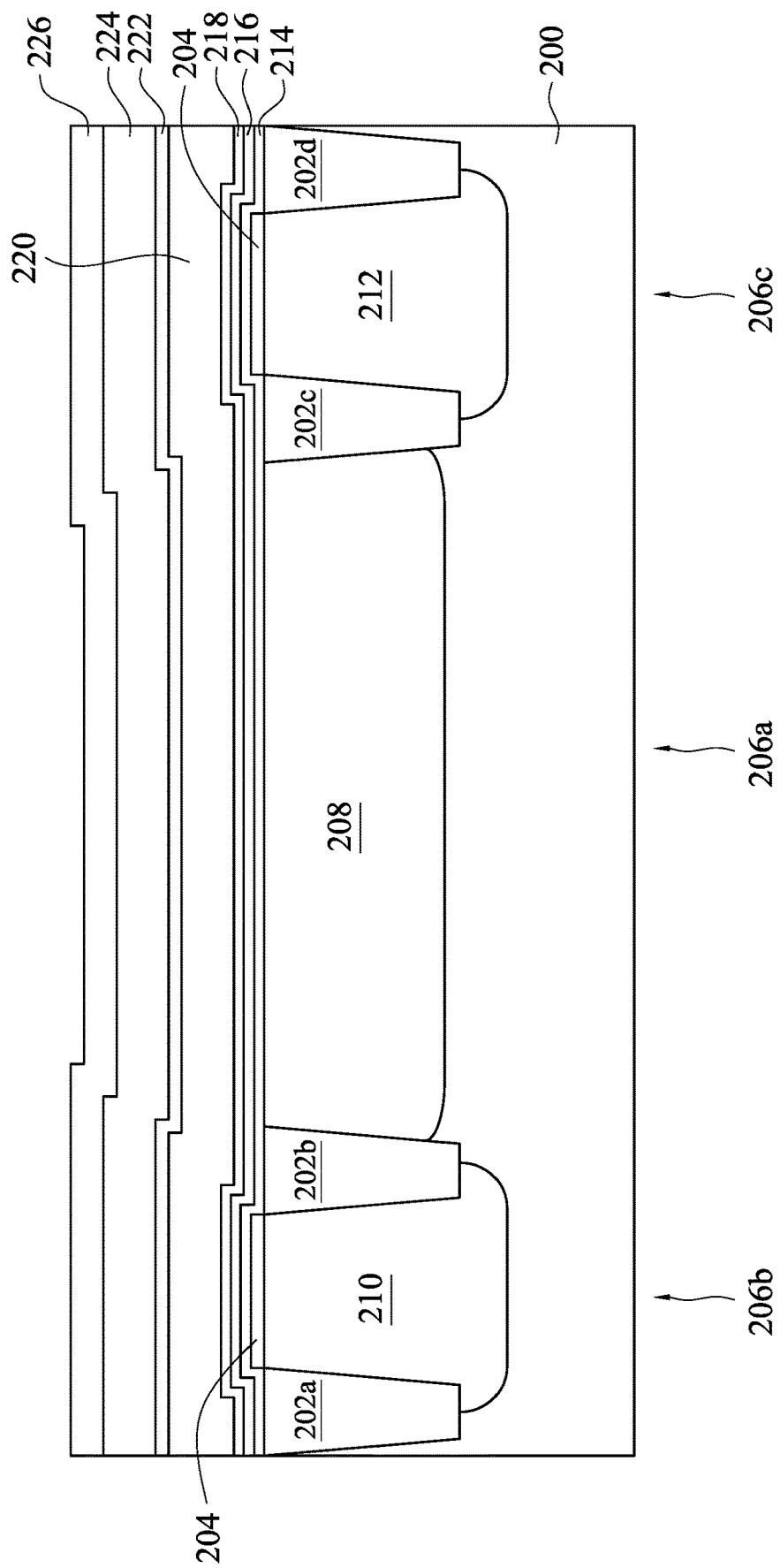
Figure 1C:
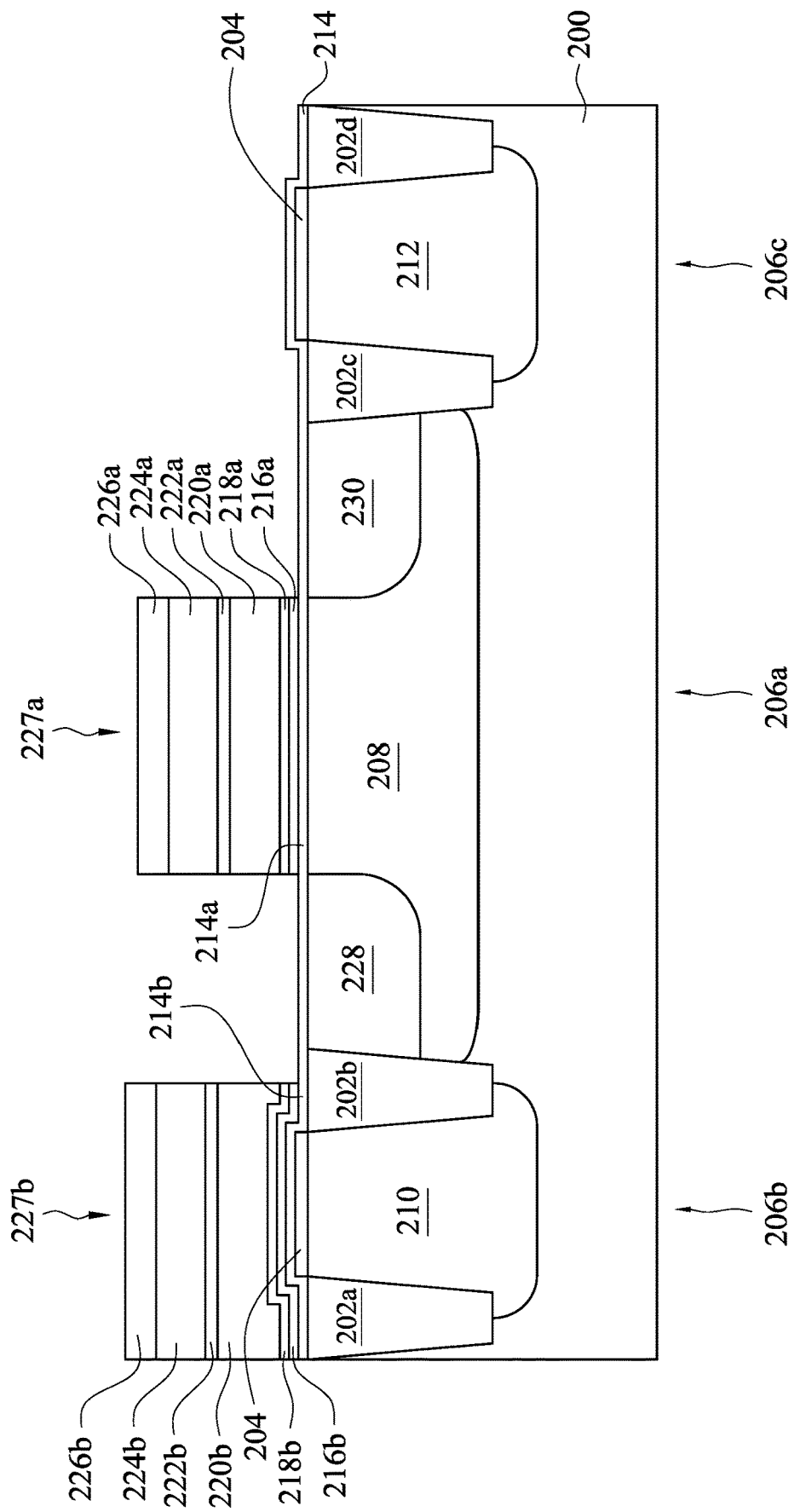
Figure 1D:
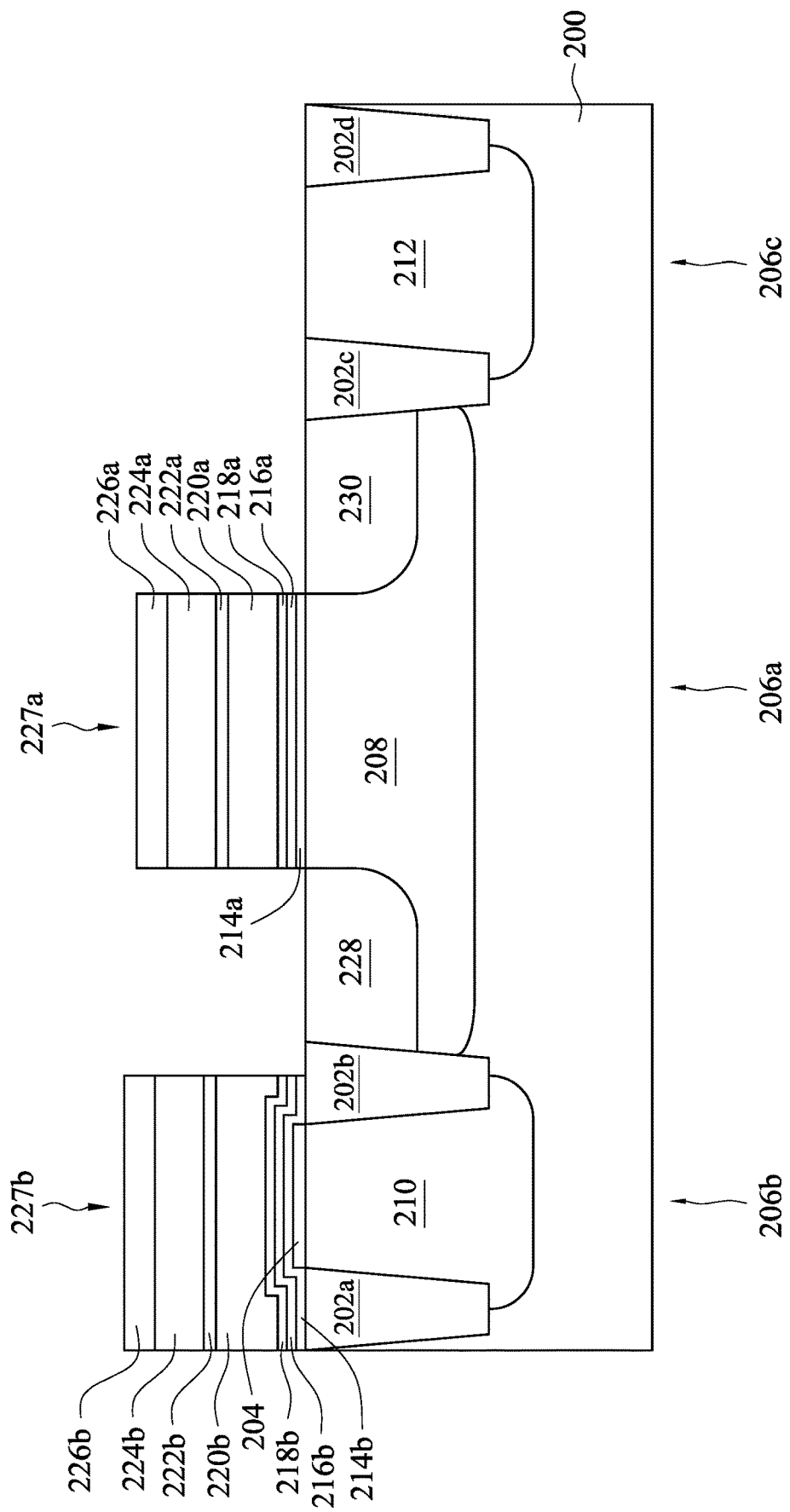
Figure 1E:
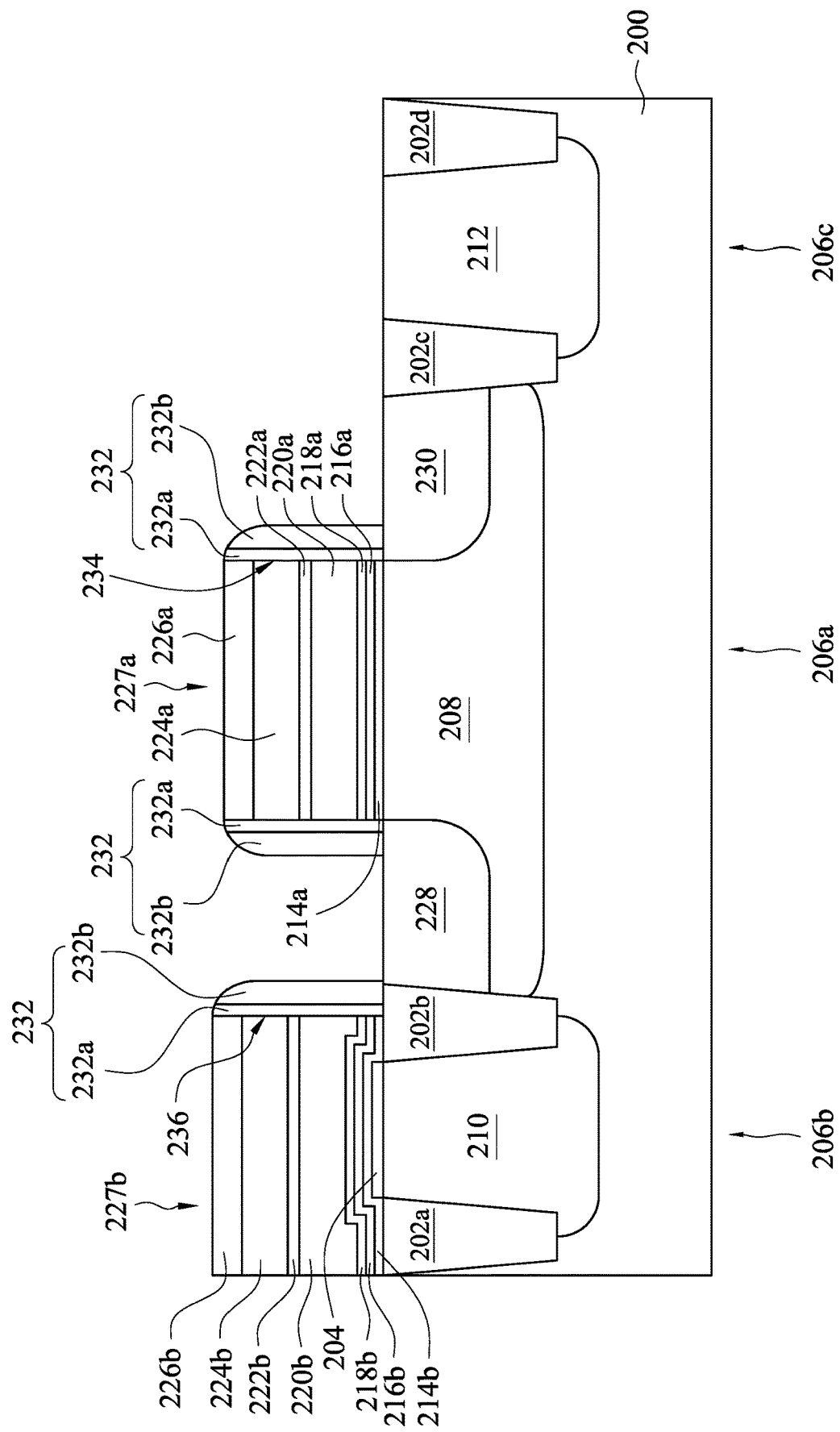
Figure 1F:
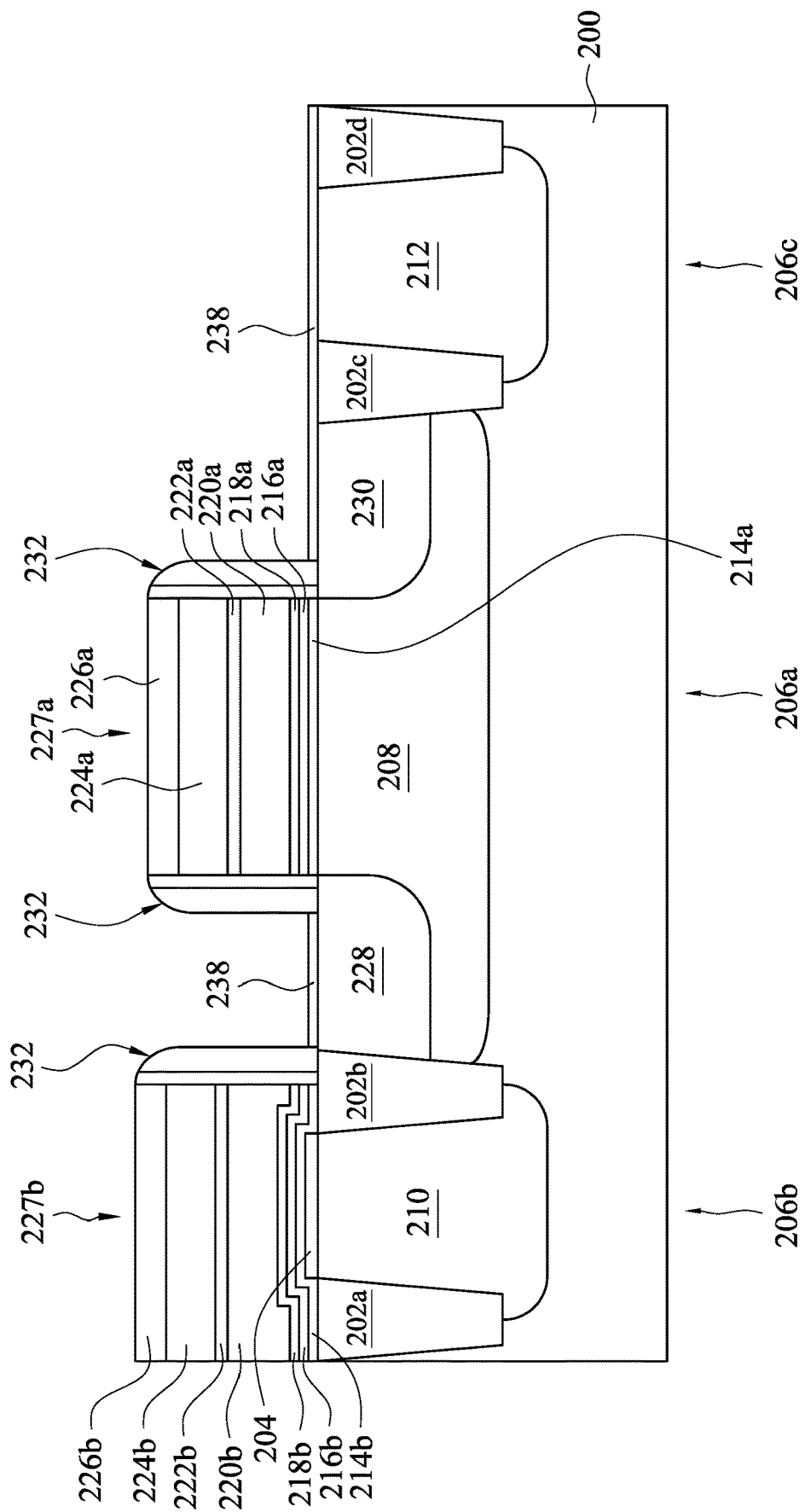
Figure 1G:
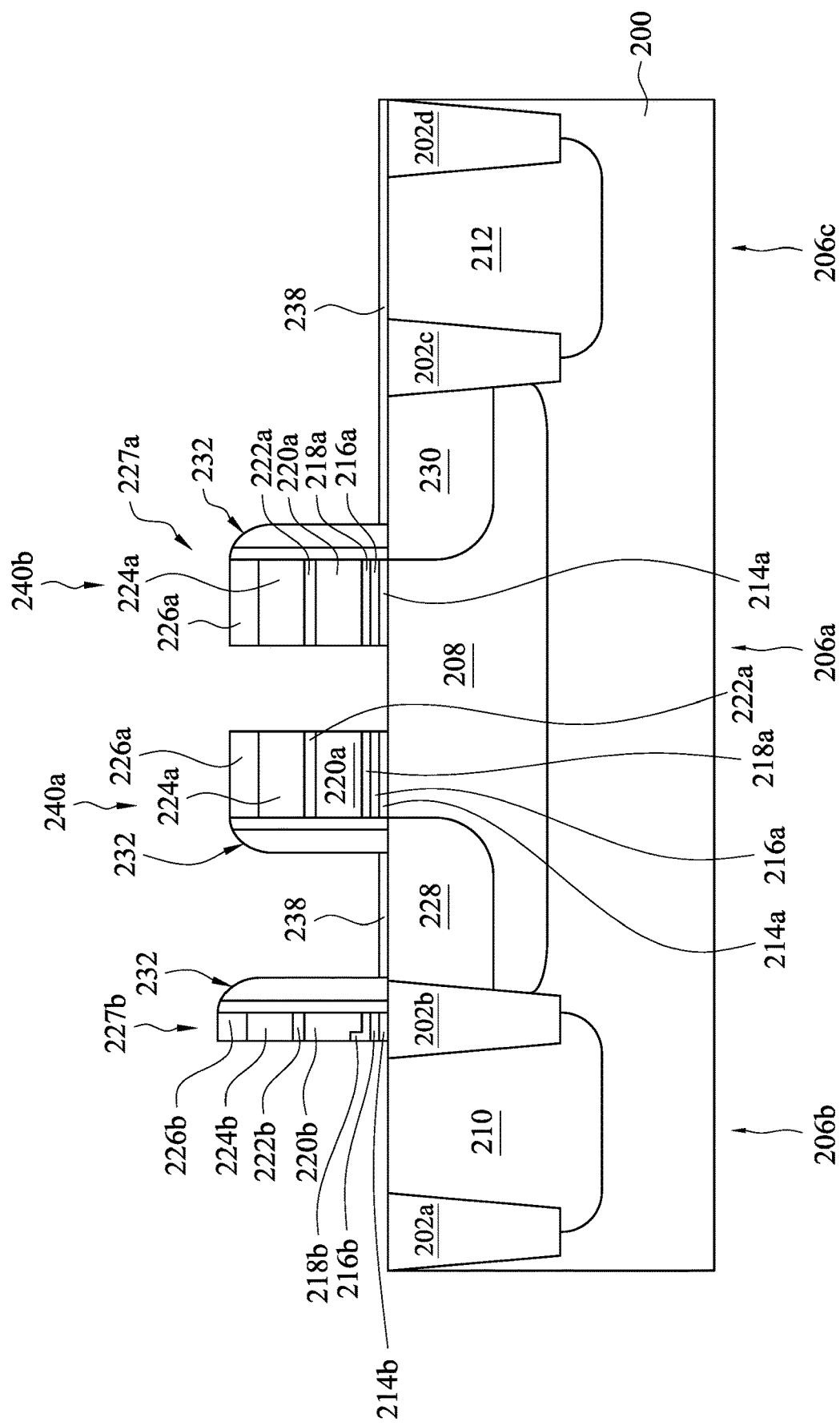
Figure 1H:
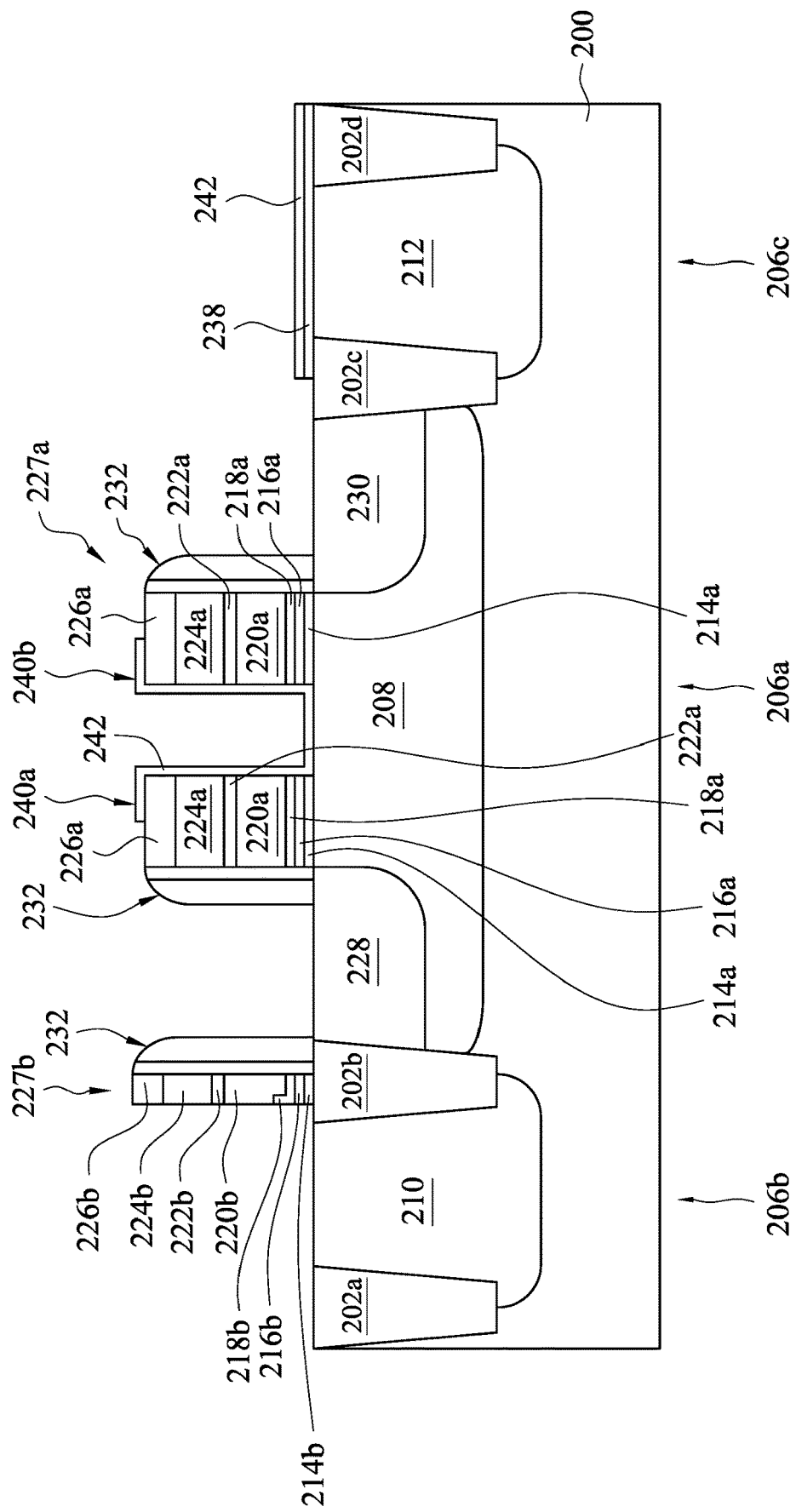
Figure 1I:
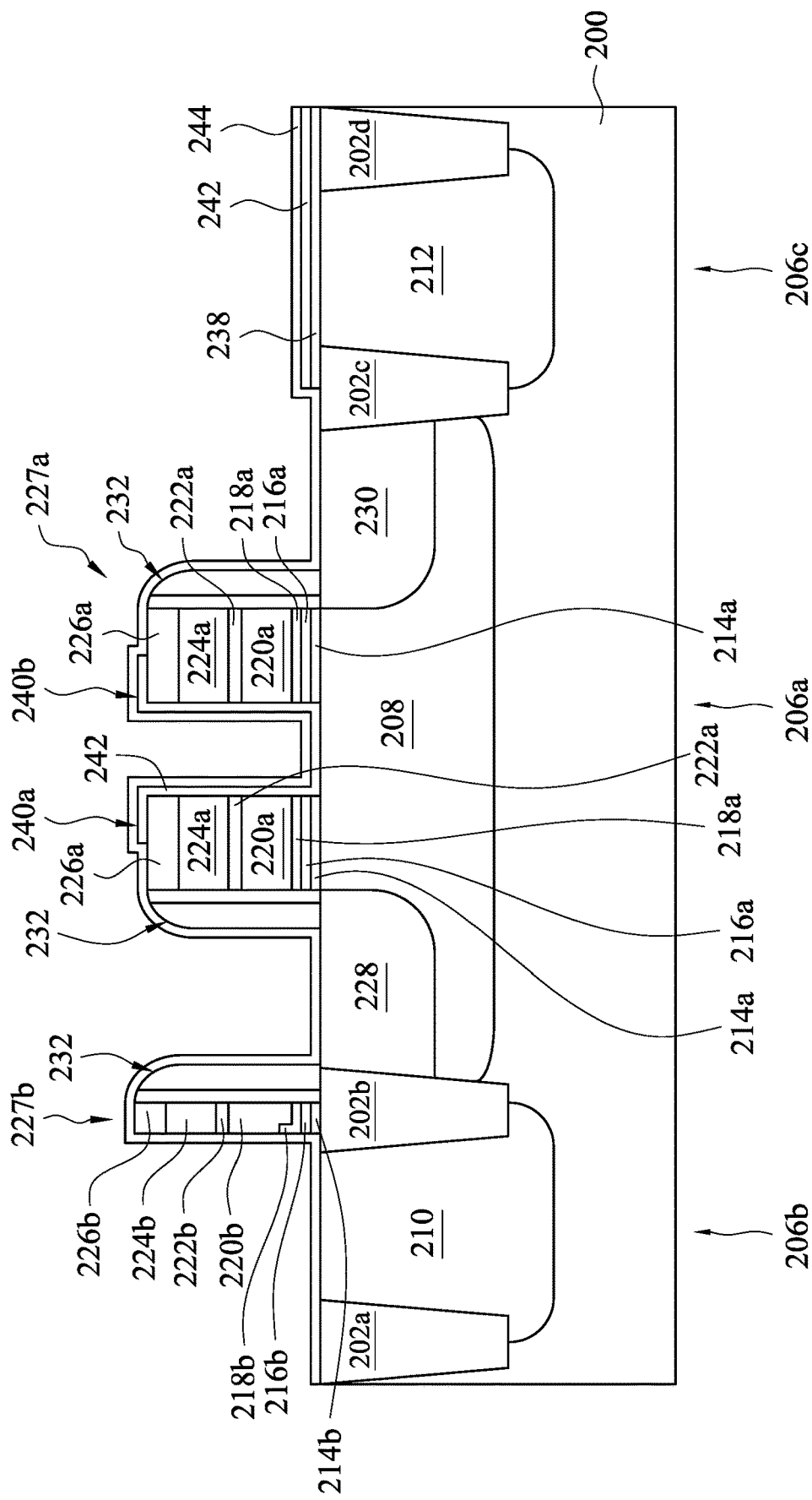
Figure 1J:
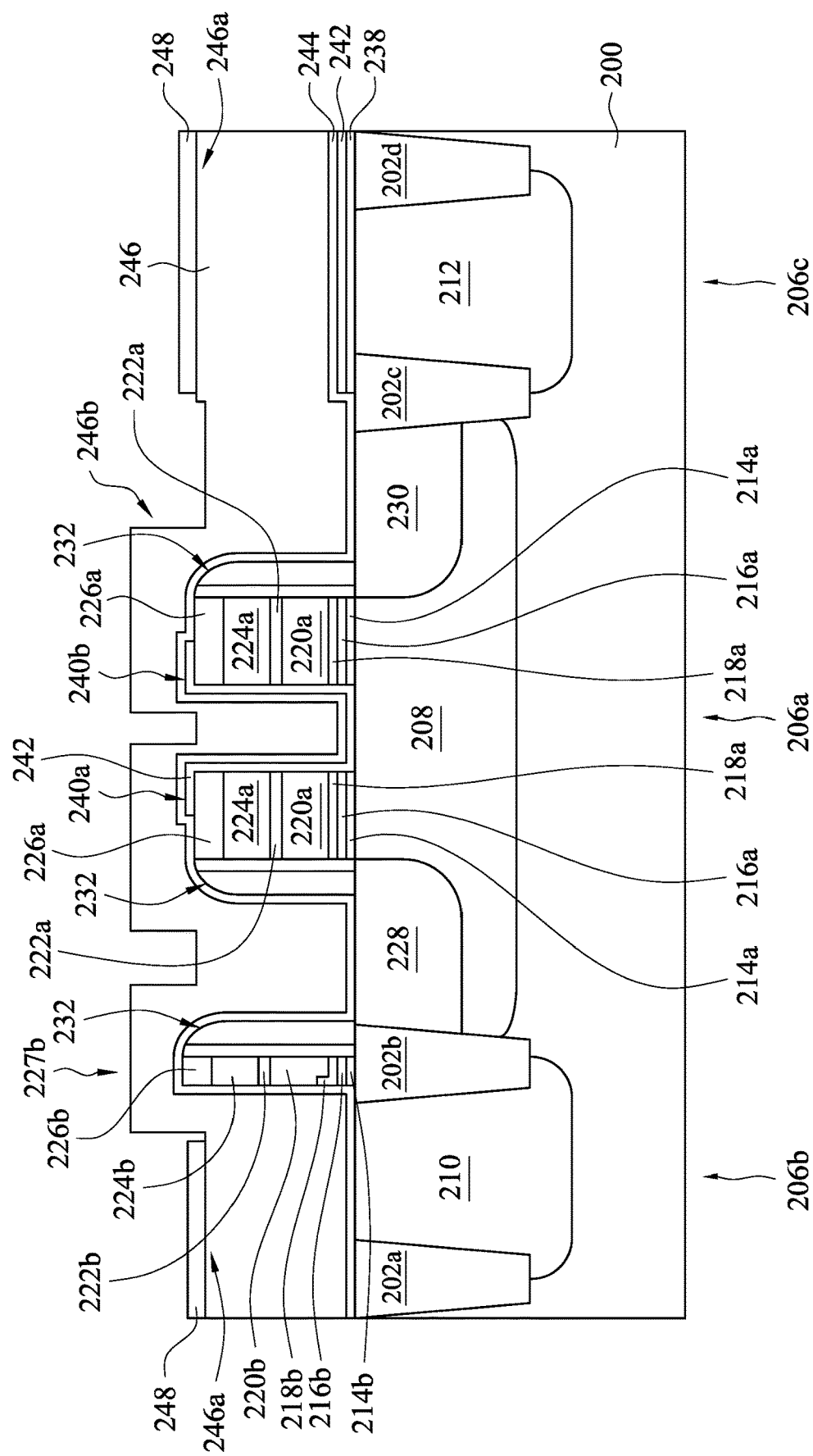
Figure 1K:
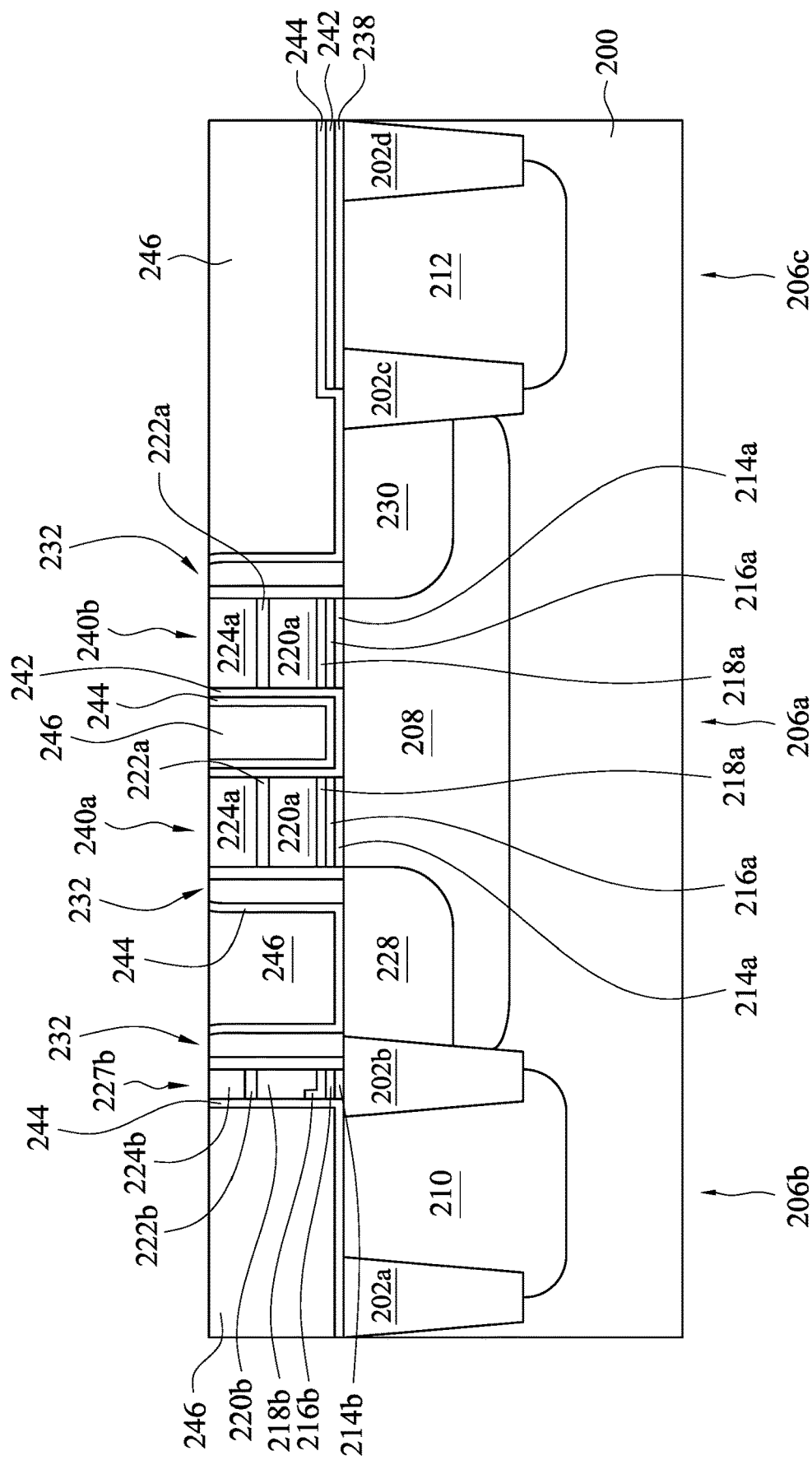
Figure 1L:
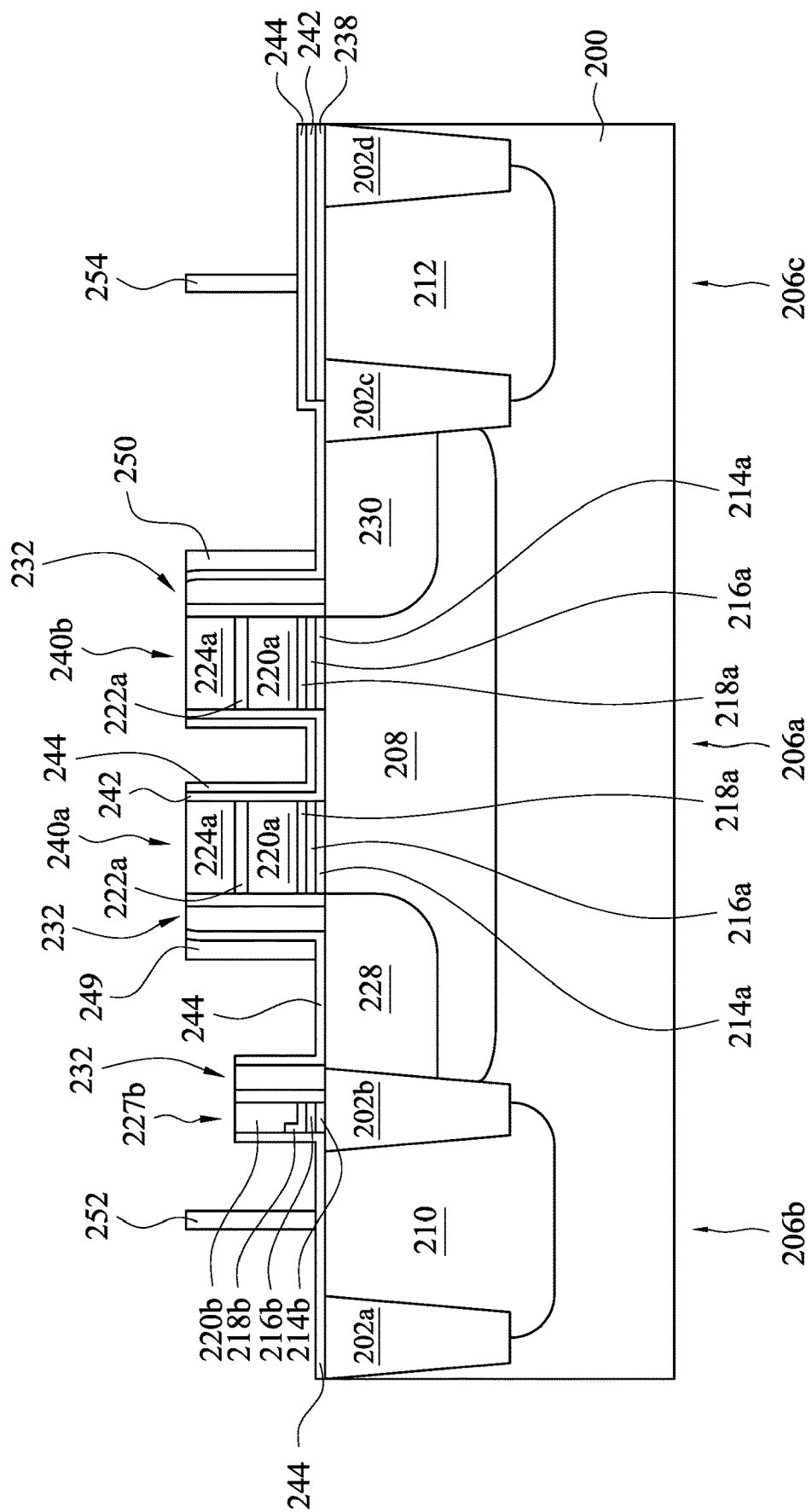
Figure 1M:
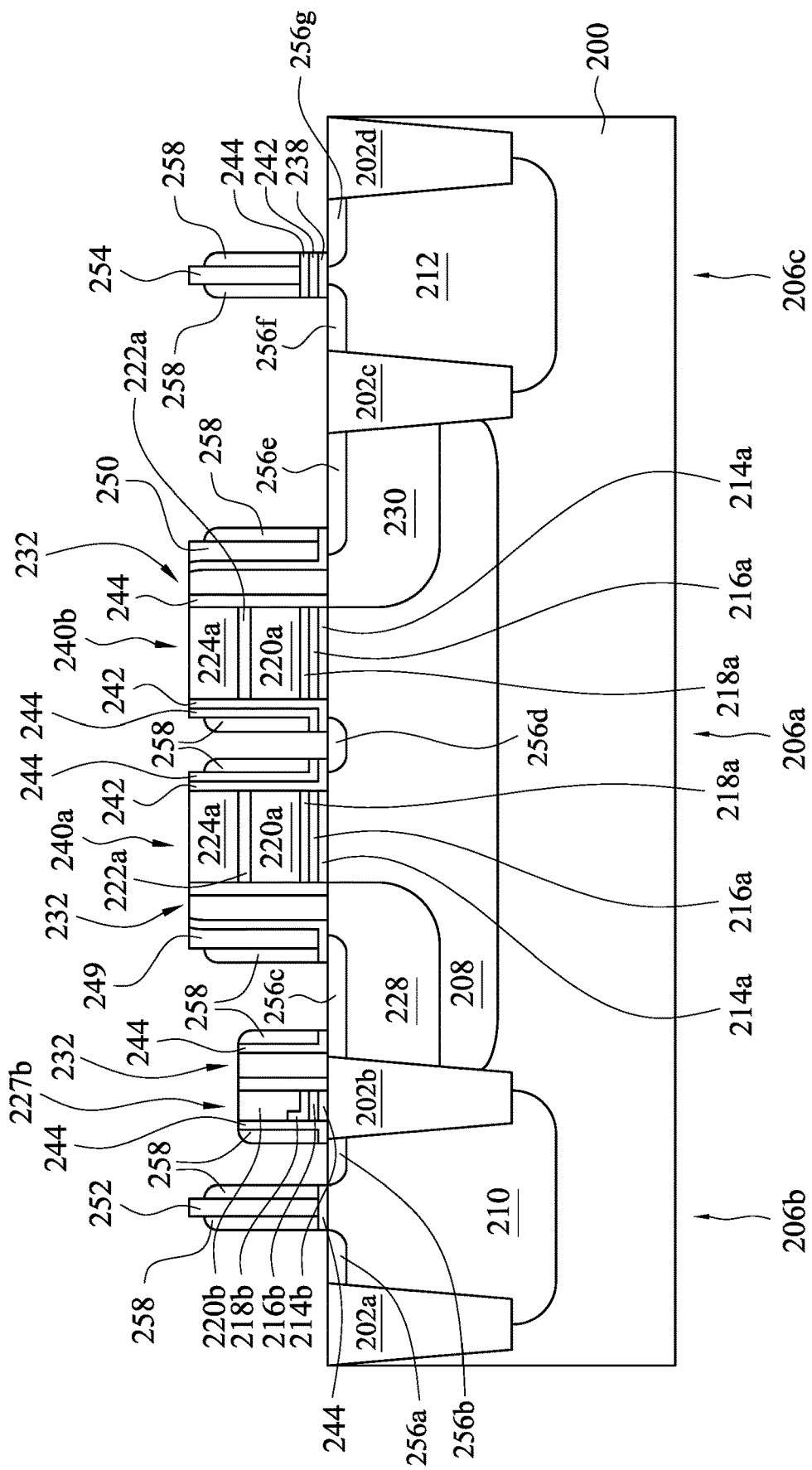
Figure 1N:
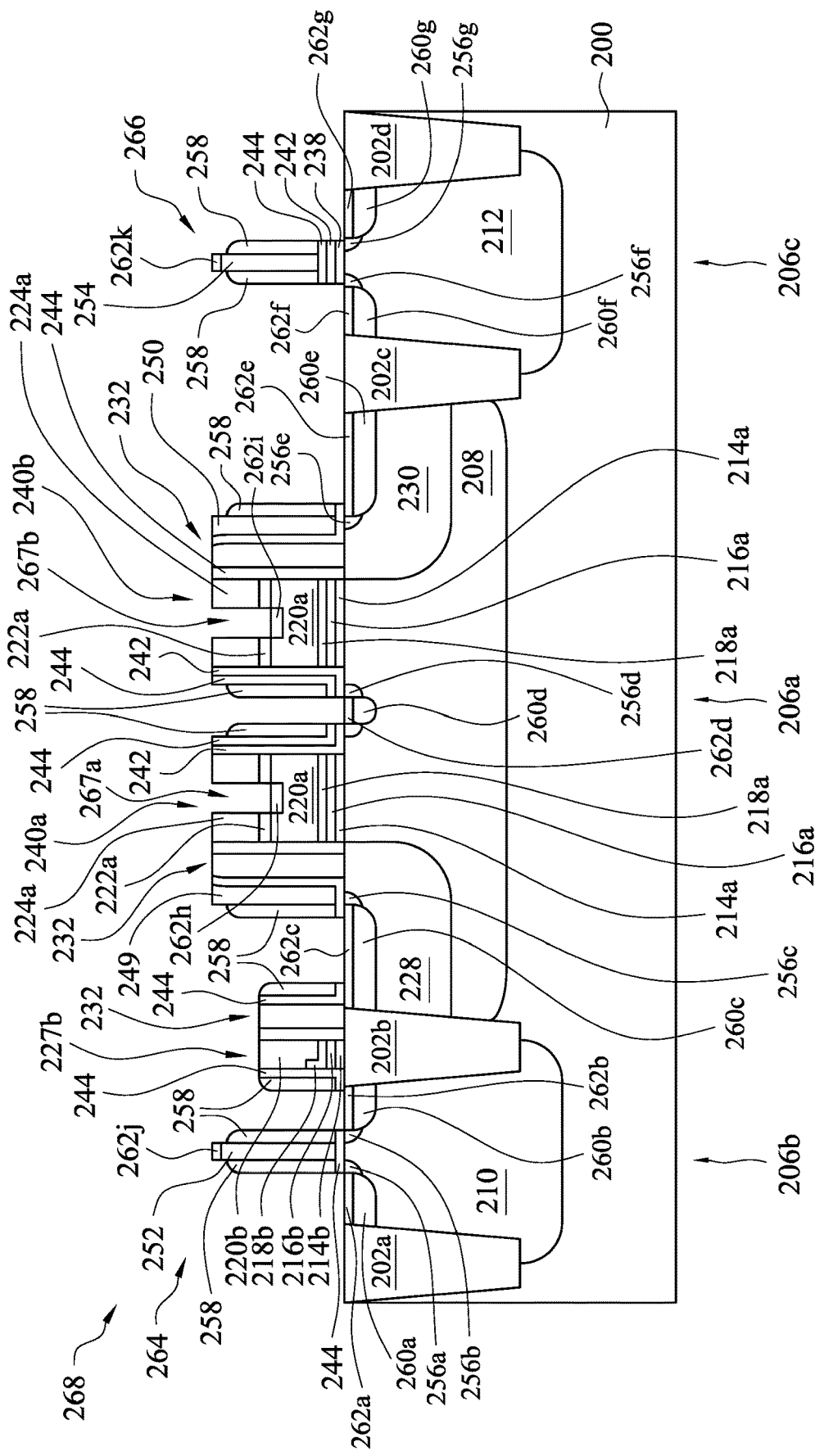

Referring to FIG. 1A through FIG. 1N, FIG. 1A through FIG. 1N are schematic cross-sectional views of intermediate stages showing a method for manufacturing a semiconductor device in accordance with various embodiments. As shown in FIG. 1A, a substrate 200 is provided. The substrate 200 may be a semiconductor substrate. The substrate 200 may be composed of a single-crystalline semiconductor material or a compound semiconductor material. For example, silicon or germanium may be used as a material forming the substrate 200. In certain examples, the substrate 200 may be a silicon on insulator (SOI) substrate.

Referring to FIG. 1A again, various isolation structures 202a, 202b, 202c, and 202d are formed in the substrate 200. In some examples, in the formation of the isolation structures 202a, 202b, 202c, and 202d, portions of the substrate 200 are removed to form various trenches in the substrate 200, an isolation material is formed to fill the trenches and to cover the substrate 200. After a chemical mechanical polish (CMP) process (not show here), the isolation material is polished to form the isolation structures 202a, 202b, 202c, and 202d in the substrate 200. The isolation structures 202a, 202b, 202c, and 202d formed in the substrate 200 at least define a first region 206a, a second region 206b, and a third region 206c, in which the first region 206a is located between the isolation structures 202b and 202c, the second region 206b is located between the isolation structures 202a and 202b, and the third region 206c is located between the isolation structures 202c and 202d. The isolation structures 202a, 202b, 202c, and 202d may be shallow trench isolation (STI) structures. The isolation material may be formed by using a high density plasma chemical vapor deposition (HDP CVD) method.

In some examples, after the isolation structures 202a, 202b, 202c, and 202d are completed, a pad oxide layer 204 is formed to cover the first region 206a, the second region 206b, the third region 206c, and the isolation structures 202a, 202b, 202c, and 202d. Then, a cell well 208, a logic well 210, and a high voltage well 212 are respectively formed in the first region 206a, the second region 206b, and the third region 206c by using an implantation technique. The implantation process may be performed using dopants, such as boron and phosphorous. The high voltage well 212 includes an n-type well and a p-type well. Then, a portion of the pad oxide layer 204, which is located on the first region 206a, is removed by using a photolithography technique and an etching technique.

In some examples, as shown in FIG. 1B, an oxide layer 214, a nitride layer 216, and an oxide layer 218 are formed to cover the substrate 200 in sequence to form an ONO structure. The oxide layer 214, the nitride layer 216, and the oxide layer 218 may be formed by using a deposition method or a growth method, such as a chemical vapor deposition (CVD) method. The oxide layers 214 and 218 may be formed from silicon oxide, and the nitride layer 216 may be formed from silicon nitride. A control gate layer 220 is formed to cover the oxide layer 218 by using a deposition method, such as a chemical vapor deposition method. The control gate layer 220 may be formed from polysilicon. In some exemplary examples, the control gate layer 220 is directly deposed on the oxide layer 218.

Referring to FIG. 1B again, a nitride layer 222, an oxide layer 224, and a nitride layer 226 are formed to cover the control gate layer 220 in sequence to form an NON structure. The nitride layer 222, the oxide layer 224, and the nitride layer 226 may be formed by using a deposition method, such as a chemical vapor deposition method. The nitride layers 222 and 226 may be formed from silicon nitride, and the oxide layer 224 may be formed from silicon oxide.

As shown in FIG. 1C, portions of the nitride layer 226, portions of the oxide layer 224, portions of the nitride layer 222, and portions of the control gate layer 220, portions of the oxide layer 218, and portions of the nitride layer 216 on the third region 206c and portions of the first region 206a are removed by using a photolithography method and an etching method. A remaining portion 226a of the nitride layer 226, a remaining portion 224a of the oxide layer 224, a remaining portion 222a of the nitride layer 222, a remaining portion 220a of the control gate layer 220, a remaining portion 218a of the oxide layer 218, a remaining portion 216a of the nitride layer 216, and a portion 214a of the oxide layer 214 which is located underlying the remaining portion 216a are stacked on the first region 206a in sequence to form a first stacked structure 227a. A remaining portion 226b of the nitride layer 226, a remaining portion 224b of the oxide layer 224, a remaining portion 222b of the nitride layer 222, a remaining portion 220b of the control gate layer 220, a remaining portion 218b of the oxide layer 218, a remaining portion 216b of the nitride layer 216, and a portion 214b of the oxide layer 214 which is located underlying the remaining portion 216b are stacked on the second region 206b in sequence to form a second stacked structure 227b. The remaining portion 226a of the nitride layer 226, the remaining portion 224a of the oxide layer 224, and the remaining portion 222a of the nitride layer 222 form a cap structure. The remaining portion 226b of the nitride layer 226, the remaining portion 224b of the oxide layer 224, and the remaining portion 222b of the nitride layer 222 form another cap structure.

Referring to FIG. 1C again, a first word line well 228 and a second word line well 230 are formed in the cell well 208, in which the first word line well 228 and the second word line well 230 are respectively adjacent to two sides of the first stacked structure 227a. In some examples, forming the first word line well 228 and the second word line well 230 is performed by forming a mask layer (not shown here) to cover the remaining portions 226b of the nitride layer 226 and the oxide layer 214 on the third region 206c by using a coating technique and a photolithography technique, and performing an implantation process on the substrate 200 to form the first word line well 228 and the second word line well 230 in the cell well 208. The implantation process may be performed using dopants, such as boron and phosphorous. In the examples, the mask layer may be formed from a photoresist material, and the mask layer may be formed by using a spin-coating process and a photolithography process. After the first word line well 228 and the second word line well 230 are completed, the mask layer is removed by, for example, stripping.

A pre-cleaning operation may be performed to remove portions of the oxide layer 214 which are exposed, and a portion of the pad oxide layer 204 which is located on the third region 206c. As shown in FIG. 1D, after the pre-cleaning operation is completed, the portions 214a and 214b of the oxide layer 214 are left, and the first word line well 228, the second word line well 230, and the third region 206c are exposed. The portion 214a of the oxide layer 214, the remaining portion 216a of the nitride layer 216, and the remaining portion 218a of the oxide layer 218 stacked in sequence form a trap storage structure. The portion 214b of the oxide layer 214, the remaining portion 216b of the nitride layer 216, and the remaining portion 218b of the oxide layer 218 stacked in sequence form a trap storage structure.

As shown in FIG. 1E, first spacers 232 are respectively formed on sidewalls 234 of the first stacked structure 227a and sidewalls 236 of the second stacked structure 227b. In some examples, each of the first spacers 232 is formed to include an oxide layer 232a and a nitride layer 232b stacked on the sidewall 234 of the first stacked structure 227a and the sidewalls 236 of the second stacked structure 227b in sequence. In some exemplary examples, forming the first spacers 232 includes blanketly forming the oxide layer 232a and the nitride layer 232b in sequence to cover the first stacked structure 227a, the second stacked structure 227b, and the substrate 200, and etching the oxide layer 232a and the nitride layer 232b to remove a portion of the oxide layer 232a and a portion of the nitride layer 232b, so as to form the first spacers 232 respectively on the sidewalls 234 of the first stacked structure 227a and the sidewalls 236 of the second stacked structure 227b. The oxide layer 232a and the nitride layer 232b may be formed by a deposition method, such as a chemical vapor deposition method. Etching the oxide layer 232a and the nitride layer 232b may be performed by using an anisotropic etching method.

After the first spacers 232 are completed, a cleaning operation may be optionally performed on the structure shown in FIG. 1E. As shown in FIG. 1F, a gate oxide layer 238 is formed to cover the third region 206c, the first word line well 228, and the second word line well 230. The gate oxide layer 238 is also referred to a high voltage gate oxide layer. The gate oxide layer 238 may be formed without using a furnace for preventing a smiling phenomenon of the portions 214a and 214b of the oxide layer 214 due to lateral diffusion of oxygen. In some exemplary examples, the gate oxide layer 238 may be formed from silicon oxide, and the gate oxide layer 238 may be formed by an in-situ steam generation (ISSG) method or a high temperature oxide (HTO) method.

As shown in FIG. 1G, a portion of the first stacked structure 227a and a portion of the second stacked structure 227b are removed to expose the logic well 210 and a portion of the cell well 208. The portion of the first stacked structure 227a is removed to form a first device structure 240a and a second device structure 240b. In each of the first device structure 240a and the second device structure 240b, the remaining portion 220a is a control gate. The first device 240a and the second device structure 240b are separated from each other. The first word line well 228 is adjacent to the first device structure 240a, and the second word line well 230 is adjacent to the second device structure 240b. The remaining portion of the second stacked structure 227b may be located on the isolation structure 202b.

In some examples, in removing the portion of the first stacked structure 227a and the portion of the second stacked structure 227b, a mask layer (not shown here) is formed to cover the first stacked structure 227a, the second stacked structure 227b, the first spacers 232, and the gate oxide layer 238, and the mask layer is patterned to remove portions of the mask layer to expose the portion of the first stacked structure 227a and the portion of the second stacked structure 227b, and the portion of the first stacked structure 227a and the portion of the second stacked structure 227b are etched. In some examples, the mask layer may be formed from a photoresist material, the mask layer may be formed by using a spin-coating process, and the mask layer is patterned by using a photolithography process. In some exemplary examples, a dry etching process is performed to remove portions of the nitride layer 226, portions of the oxide layer 224, portions of the nitride layer 222, portions of the control gate layer 220, portions of the oxide layer 218, and portions of the nitride layer 216 in the first stacked structure 227a and the second stacked structure 227b to expose the underlying oxide layer 214, and then a wet etching process, such as a dip process, is performed to remove the underlying oxide layer 214.

In some examples, a gate oxide layer 242 is formed to cover the first region 206a, the second region 206b, the third region 206c, the first device structure 240a, the second device structure 240b, the second stacked structure 227b, the isolation structures 202a-202d, and the gate oxide layer 238. Then, as shown in FIG. 1H, portions of the gate oxide layer 242 are removed, and remaining portions of the gate oxide layer 242 are located on the gate oxide layer 238, a sidewall and a portion of a top surface of the first device structure 240a, a sidewall and a portion of a top surface of the second device structure 240b, and a portion of the first region 206a between the first device structure 240a and the second device 240b. In removing the portions of the gate oxide layer 242, portions of the gate oxide layer 238, which are located on the first word line well 228 and the second word line well 230, are removed. For example, the portions of the gate oxide layer 242 are removed by using a photolithography process and a dry etching process. In some examples, the portion of the gate oxide layer 242, which is located on the second region 206b, is not removed.

As shown in FIG. 1I, a gate oxide 244 is formed to cover the first region 206a, the second region 206b, the third region 206c, the first device structure 240a, the second device structure 240b, the second stacked structure 227b, and the isolation structures 202a-202d, such that the gate oxide layer 244 covers the gate oxide layer 242. The gate oxide 244 covers the sidewall of the first device structure 240a, the sidewall of the second device structure 240b, and the sidewall of the second stacked structure 227b to protect the remaining portions 220a and 220b of the control gate layer 220 during a subsequent word line process.

As shown in FIG. 1J, a conductive layer 246 is formed to cover the gate oxide layer 244, such that the conductive layer 246 cover the first device structure 240a and the second device structure 240b on the first region 206a, the second stacked structure 227b, the isolation structures 202a-202d, the second region 206b, and the third region 206c. In some exemplary examples, the conductive layer 246 may be formed from polysilicon, and may be formed by using a deposition method, such as a chemical vapor deposition method.

Referring to FIG. 1J again, a hard mask layer 248 is formed on first portions 246a of the conductive layer 246, in which the first portions 246a of the conductive layer 246 are located on the second region 206b and the third region 206c. In some exemplary examples, the hard mask layer 248 is blanketly formed on the conductive layer 246, and then a portion of the hard mask layer 248 which is located on the first region 206a and on the second stacked structure 227b is removed by using, for example, a photolithography process and an etching process.

As shown in FIG. 1K, after the hard mask layer 248 is completed, an etching back process is performed on the conductive layer 246 to remove a second portion 246b of the conductive layer 246 and a portion of the gate oxide layer 244, so as to expose the first device structure 240a, the second device structure 240b, and the second stacked structure 227b. The second portion 246b of the conductive layer 246 is located over the first device structure 240a, the second device structure 240b, and the second stacked structure 227b. The portion of the gate oxide layer 244 is located on the first device structure 240a, the second device structure 240b, and the second stacked structure 227b. The etching back process may stop on the remaining portions 224a and 224b of the oxide layer 224. For example, the etching back process may be performed by using a dry etch technique. In some exemplary examples, the etching back process may remove portions of the spacers 232. The etching back process can planarize the conductive layer 246. After the etching back process is completed, the hard mask layer 248 is removed.

As shown in FIG. 1L, portions of the remaining conductive layer 246 are removed to expose the gate oxide layer 244 by using a photolithography method and an etching method, so as to form a first word line 249, a second word line 250, a gate 252 of a logic device 264 (see to FIG. 1N), and a gate 254 of a high voltage device 266 (see to FIG. 1N). The first word line 249 is located on the gate oxide layer 244 over the first word line well 228 and is adjacent to the first spacer 232 on the sidewall of the first device structure 240a. The second word line 250 is located on the gate oxide layer 244 over the second word line well 230 and is adjacent to the first spacer 232 on the sidewall of the second device structure 240b. The gate 252 of the logic device 264 is located on the gate oxide layer 244 over the logic well 210. The gate 254 of the high voltage device 266 is located on the gate oxide layers 244, 242, and 238 over the high voltage well 212. In removing the portions of the remaining conductive layer 246, a portion of the gate oxide layer 244 on the sidewalls of the second stacked structure 227b, the remaining portion 224b of the oxide layer 224, and the remaining portion 222b of the nitride layer 222 are removed.

As shown in FIG. 1M, lightly doped drains (LDDs) 256a and 256b are formed in the logic well 210, a lightly doped drain 256c is formed in the first word line well 228, a lightly doped drain 256d is formed in the cell well 208 between the first device structure 240a and the second device structure 240b, a lightly doped drain 256e is formed in the second word line well 230, and lightly doped drains 256f and 256g are formed in the high voltage well 212 by using, for example, an implantation method. The lightly doped drains 256a and 256b are formed at opposite sides of the gate 252 and adjacent to the gate 252, the lightly doped drain 256c is formed in the first word line well 228 adjacent the first word line 249, the lightly doped drain 256e is formed in the second word line well 230 adjacent the second word line 250, and the lightly doped drains 256f and 256g are formed in the high voltage well 212 at opposite sides of the gate 254 and adjacent to the gate 254. In some examples, the lightly doped drain 256d is formed optionally.

Referring to FIG. 1M again, after the lightly doped drains 256a-256g are completed, various second spacers 258 are respectively formed on sidewalls of the gate 252 of the logic device 264, sidewalls of the gate 254 the high voltage device 266, the sidewalls of the first device structure 240a, and the sidewalls of the second device structure 240b. In the first device structure 240a, one of the second spacers 258 is disposed on a sidewall of the first word line 249, and another one of the second spacers 258 is disposed on the gate oxide layer 244 at the side of the first device structure 240a opposite to the first word line 249. In the second device structure 240b, one of the second spacers 258 is disposed on a sidewall of the second word line 250, and another one of the second spacers 258 is disposed on the gate oxide layer 244 at the side of the second device structure 240b opposite to the second word line 250. Two of the second spacers 258 may be respectively formed on the sidewalls of the second stacked structure 227b.

In some exemplary examples, forming the second spacers 258 includes blanketly forming a spacer material layer to cover the first device structure 240, the second device structure 240b, the second stacked structure 227b, the gate 252, the gate 254, the first word line 249, the second word line 250, the gate oxide 244, and the substrate 200, and etching the spacer material layer to remove a portion of the spacer material layer, so as to form the second spacers 258. The spacer material layer may be formed by a deposition method, such as a chemical vapor deposition method. Etching the spacer material layer may be performed by using an anisotropic etching method. For example, the spacer material layer may include an oxide layer and a nitride layer stacked on the oxide layer.

As shown in FIG. 1N, a first contact hole 267a and a second contact hole 267b are respectively formed in the first device structure 240a and the second device structure 240b. For example, the first contact hole 267a and the second contact hole 267b may be formed by using a photolithography method and an etching method. Forming the first contact hole 267a and the second contact hole 267b is performed to remove a portions of each of the remaining portions 224a of the oxide layer 224 and a portion of each of the remaining portion 222a of the nitride layer 222, so as to expose a portion of each of the remaining portion 220a of the control gate layer 220. The remaining portion 220a of the control gate layer 220 are control gates of the first device structure 240a and the second device structure 240b.

Referring to FIG. 1N again, source/drain regions 260a-260g are respectively formed in the lightly doped drains 256a-256g in the substrate 200 by performing N+ or P+ S/D implantation processes. After the source/drain regions 260a-260g are completed, silicide layers 262a-262k are on the source/drain regions 260a-260g, the control gates (i.e. the remaining portions 220a of the control gate layer 220) of the first device structure 240a and the second device structure 240b, and the gate 262 of the logic device 264, and the gate 254 the high voltage device 266, such that a semiconductor device 268 is substantially completed.

Each of the first device structure 240a and the second device structure 240b includes an ONO structure as the trap storage structure, and the process of forming the gate oxide layers 238, 242 and 244 of the high voltage device 266 can be integrated with the process of forming the first device structure 240a and the second device structure 240b easily. Therefore, a process for forming the semiconductor device 268 including the ONO trap storage structure can be simplified. In addition, the ONO trap storage structure is thinner than a conventional polysilicon floating gate, and the control gate can be directly stacked on the trap storage structure. Thus, each of the first device structure 240a and the second device structure 240b has a lower structure topology which is close to that of other devices, such that the subsequent patterning processes of the semiconductor device 268 are relatively easy, thereby further simplifying a process for manufacturing the semiconductor device 268 and integration of the processes of the semiconductor device 268 and the other devices, and decreasing process time and reducing process cost.

Furthermore, by using the ONO structure as the trap storage structure, the semiconductor device 268 can be programmed using a source side injection (SSI) programming method, and can be erased using a Fowler-Nordheim (FN) erase method, thereby decreasing power consumption of the semiconductor device 268. Moreover, because the semiconductor device 268 can be programmed by a SSI programming method, the programming operation of the semiconductor device 268 can be performed by a byte mode.

Figure 2:
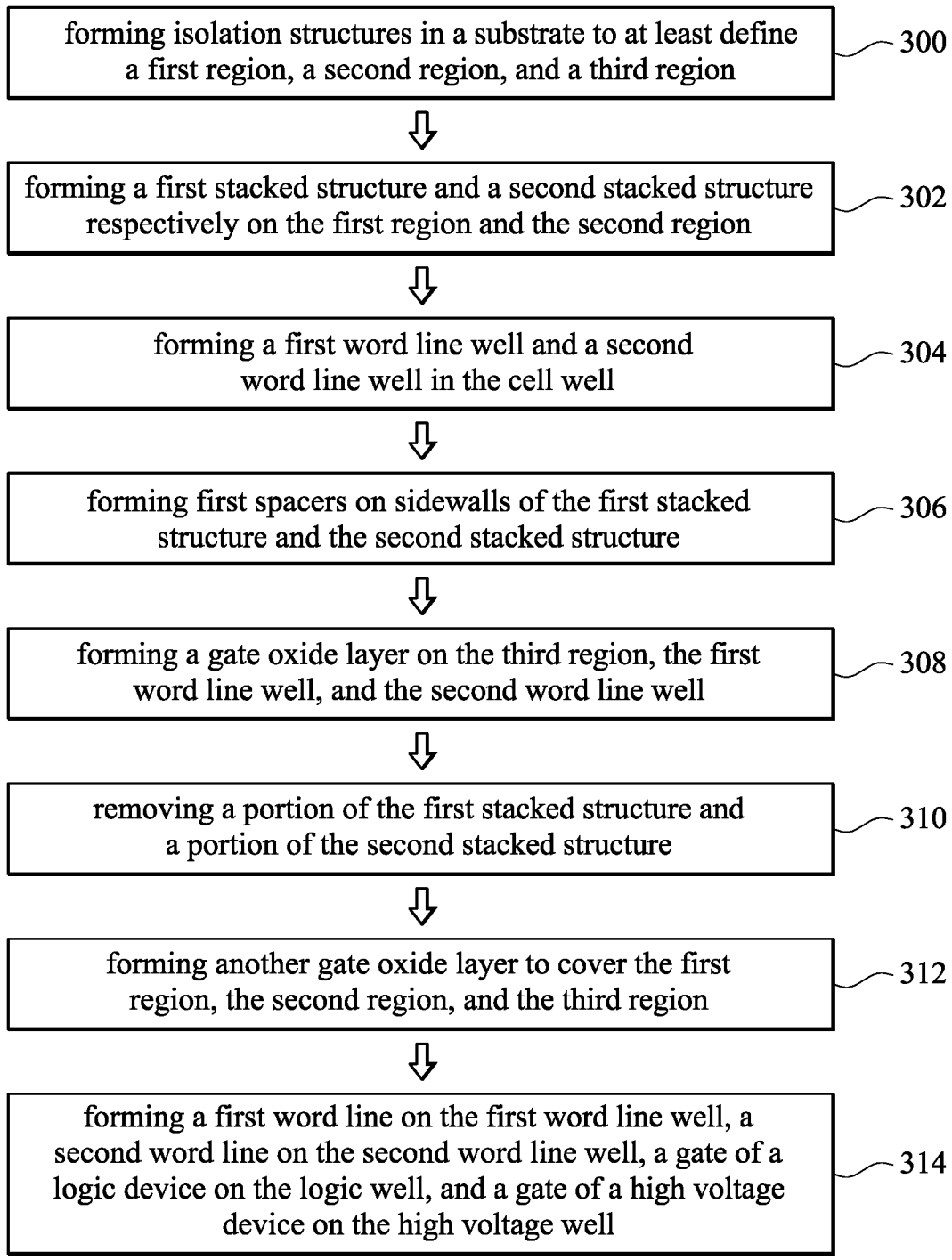
FIG. 2 is a flow chart of a method for manufacturing a semiconductor device in accordance with various embodiments.

Referring to FIG. 2 with FIG. 1A through FIG. 1N, FIG. 2 is a flow chart of a method for manufacturing a semiconductor device in accordance with various embodiments. The method begins at operation 300, where a substrate 200 is provided. The substrate 200 may be a semiconductor substrate, such as a crystalline semiconductor substrate or a compound semiconductor substrate. For example, silicon or germanium may be used as a material forming the substrate 200. In certain examples, the substrate 200 may be a silicon on insulator substrate.

Then, as shown in FIG. 1A, various isolation structures 202a, 202b, 202c, and 202d are formed in the substrate 200. In some examples, in forming the isolation structures 202a-202d, portions of the substrate 200 are removed to form various trenches in the substrate 200, an isolation material is formed to fill the trenches and to cover the substrate 200. After a chemical mechanical polish process, the isolation material is polished to form the isolation structures 202a-202d in the substrate 200. The isolation structures 202a-202d formed in the substrate 200 at least define a first region 206a, a second region 206b, and a third region 206c. The isolation structures 202a, 202b, 202c, and 202d may be shallow trench isolation structures. The isolation material may be formed by using a high density plasma chemical vapor deposition method.

In some examples, a pad oxide layer 204 is formed to cover the first region 206a, the second region 206b, the third region 206c, and the isolation structures 202a-202d by a deposition method, such as a chemical vapor deposition method. Then, a cell well 208, a logic well 210, and a high voltage well 212 are respectively formed in the first region 206a, the second region 206b, and the third region 206c by using an implantation technique. The cell well 208, the logic well 210, and the high voltage well 212 may be formed using dopants, such as boron and phosphorous. Then, a portion of the pad oxide layer 204, which is located on the first region 206a, is removed by using a photolithography technique and an etching technique.

At operation 302, as shown in FIG. 1C, a first stacked structure 227a and a second stacked structure 227b are respectively formed on the first region 206a and the second region 206b. In some examples, in forming the first stacked structure 227a and the second stacked structure 227b, an oxide layer 214, a nitride layer 216, and an oxide layer 218 are formed to cover the substrate 200 in sequence to form an ONO structure, as shown in FIG. 1B. The oxide layer 214, the nitride layer 216, and the oxide layer 218 may be formed by using a deposition method or a growth method, such as a chemical vapor deposition method. A control gate layer 220 is formed to cover the oxide layer 218 by using a deposition method, such as a chemical vapor deposition method. In some exemplary examples, the control gate layer 220 is directly deposed on the oxide layer 218. Then, as shown in FIG. 1B, a nitride layer 222, an oxide layer 224, and a nitride layer 226 are formed to cover the control gate layer 220 in sequence to form an NON structure. The nitride layer 222, the oxide layer 224, and the nitride layer 226 may be formed by using a deposition method, such as a chemical vapor deposition method.

Portions of the nitride layer 226, portions of the oxide layer 224, portions of the nitride layer 222, and portions of the control gate layer 220, portions of the oxide layer 218, and portions of the nitride layer 216 on the third region 206c and portions of the first region 206a are removed by using a photolithography method and an etching method. As shown in FIG. 1C, a remaining portion 226a of the nitride layer 226, a remaining portion 224a of the oxide layer 224, a remaining portion 222a of the nitride layer 222, a remaining portion 220a of the control gate layer 220, a remaining portion 218a of the oxide layer 218, a remaining portion 216a of the nitride layer 216, and a portion 214a of the oxide layer 214 which is located underlying the remaining portion 216a are stacked on the first region 206a in sequence to form the first stacked structure 227a. A remaining portion 226b of the nitride layer 226, a remaining portion 224b of the oxide layer 224, a remaining portion 222b of the nitride layer 222, a remaining portion 220b of the control gate layer 220, a remaining portion 218b of the oxide layer 218, a remaining portion 216b of the nitride layer 216, and a portion 214b of the oxide layer 214 which is located underlying the remaining portion 216b are stacked on the second region 206b in sequence to form the second stacked structure 227b. The remaining portion 226a of the nitride layer 226, the remaining portion 224a of the oxide layer 224, and the remaining portion 222a of the nitride layer 222 form a cap structure. The remaining portion 226b of the nitride layer 226, the remaining portion 224b of the oxide layer 224, and the remaining portion 222b of the nitride layer 222 form another cap structure.

At operation 304, referring to FIG. 1C again, a first word line well 228 and a second word line well 230 are formed in the cell well 208. The first word line well 228 and the second word line well 230 are respectively formed to be adjacent to two sides of the first stacked structure 227a. In some examples, forming the first word line well 228 and the second word line well 230 is performed by forming a mask layer (not shown here) to cover the remaining portions 226b of the nitride layer 226 and the oxide layer 214 on the third region 206c by using a coating technique and a photolithography technique, and performing an implantation process on the substrate 200 to form the first word line well 228 and the second word line well 230 in the cell well 208. Then, the mask layer is removed by, for example, stripping. In the examples, the mask layer may be formed from a photoresist material, and the mask layer may be formed by using a spin-coating process and a photolithography process.

As shown in FIG. 1D, a pre-cleaning operation may be performed to remove portions of the oxide layer 214 which are exposed, and a portion of the pad oxide layer 204 which is located on the third region 206c. After the pre-cleaning operation is completed, the portion 214a of the oxide layer 214, the remaining portion 216a of the nitride layer 216, and the remaining portion 218a of the oxide layer 218 stacked in sequence form a trap storage structure. The portion 214b of the oxide layer 214, the remaining portion 216b of the nitride layer 216, and the remaining portion 218b of the oxide layer 218 stacked in sequence form a trap storage structure.

At operation 306, as shown in FIG. 1E, various first spacers 232 are respectively formed on sidewalls 234 of the first stacked structure 227a and sidewalls 236 of the second stacked structure 227b. In some examples, each of the first spacers 232 is formed to include an oxide layer 232a and a nitride layer 232b stacked in sequence. In some exemplary examples, in forming the first spacers 232, the oxide layer 232a and the nitride layer 232b are blanketly formed in sequence to cover the first stacked structure 227a, the second stacked structure 227b, and the substrate 200, and the oxide layer 232a and the nitride layer 232b are etched to remove a portion of the oxide layer 232a and a portion of the nitride layer 232b, so as to form the first spacers 232. The oxide layer 232a and the nitride layer 232b may be formed by a deposition method, such as a chemical vapor deposition method. The oxide layer 232a and the nitride layer 232b may be etched by using an anisotropic etching method. After the first spacers 232 are completed, a cleaning operation may be optionally performed on the structure shown in FIG. 1E.

At operation, as shown in FIG. 1F, a gate oxide layer 238 is formed to cover the third region 206c, the first word line well 228, and the second word line well 230. The gate oxide layer 238 is also referred to a high voltage gate oxide layer. The gate oxide layer 238 may be formed without using a furnace for preventing a smiling phenomenon of the portions 214a and 214b of the oxide layer 214 due to lateral diffusion of oxygen. In some exemplary examples, the gate oxide layer 238 may be formed by an in-situ steam generation method or a high temperature oxide method.

At operation 310, as shown in FIG. 1G, a portion of the first stacked structure 227a and a portion of the second stacked structure 227b are removed to expose the logic well 210 and a portion of the cell well 208. The portion of the first stacked structure 227a is removed to form a first device structure 240a and a second device structure 240b, and the first device 240a and the second device structure 240b are separated from each other. The exposed portion of the cell well 208 is located between the first device structure 240a and the second device structure 240b. The first word line well 228 is adjacent to the first device structure 240a, and the second word line well 230 is adjacent to the second device structure 240b. The remaining portion of the second stacked structure 227b may be located on the isolation structure 202b. The remaining portions 220a are control gates of the first device structure 240a and the second device structure 240b.

In some examples, in removing the portion of the first stacked structure 227a and the portion of the second stacked structure 227b, a mask layer (not shown here) is formed to cover the first stacked structure 227a, the second stacked structure 227b, the first spacers 232, and the gate oxide layer 238, and the mask layer is patterned to remove portions of the mask layer to expose the portion of the first stacked structure 227a and the portion of the second stacked structure 227b, and then the portion of the first stacked structure 227a and the portion of the second stacked structure 227b are etched to expose the substrate 200. In some examples, the mask layer may be formed from a photoresist material, the mask layer may be formed by using a spin-coating process, and the mask layer is patterned by using a photolithography process. In some exemplary examples, a dry etching process is performed to remove portions of the nitride layer 226, portions of the oxide layer 224, portions of the nitride layer 222, portions of the control gate layer 220, portions of the oxide layer 218, and portions of the nitride layer 216 in the first stacked structure 227a and the second stacked structure 227b to expose the underlying oxide layer 214, and then a wet etching process, such as a dip process, is performed to remove the underlying oxide layer 214.

In some examples, a gate oxide layer 242 is formed to cover the first region 206a, the second region 206b, the third region 206c, the first device structure 240a, the second device structure 240b, the second stacked structure 227b, the isolation structures 202a-202d, and the gate oxide layer 238. Then, portions of the gate oxide layer 242 are removed. As shown in FIG. 1H, remaining portions of the gate oxide layer 242 are located on the gate oxide layer 238, a sidewall and a portion of a top surface of the first device structure 240a, a sidewall and a portion of a top surface of the second device structure 240b, and a portion of the first region 206a between the first device structure 240a and the second device 240b. In removing the portions of the gate oxide layer 242, portions of the gate oxide layer 238, which are located on the first word line well 228 and the second word line well 230, are removed. For example, the portions of the gate oxide layer 242 are removed by using a photolithography process and a dry etching process. In some examples, the portion of the gate oxide layer 242, which is located on the second region 206b, is not removed.

At operation 312, as shown in FIG. 1I, a gate oxide 244 is formed to cover the first region 206a, the second region 206b, the third region 206c, the first device structure 240a, the second device structure 240b, the second stacked structure 227b, and the isolation structures 202a-202d, such that the gate oxide 244 covers the gate oxide layer 242. The gate oxide 244 covers the sidewall of the first device structure 240a, the sidewall of the second device structure 240b, and the sidewall of the second stacked structure 227b to protect the remaining portions 220a and 220b of the control gate layer 220 during a subsequent word line process.

At operation 314, as shown in FIG. 1L, a first word line 249 is formed on the first word line well 228, a second word line 250 is formed on the second word line well 230, a gate 252 of a logic device 264 (see FIG. 1N) is formed on the logic well 210, and a gate 254 of a high voltage device 266 (see FIG. 1N) is formed on the high voltage well 212. In some examples, as shown in FIG. 1J, a conductive layer 246 is formed to cover the gate oxide layer 244, such that the conductive layer 246 cover the first device structure 240a and the second device structure 240b on the first region 206a, the second stacked structure 227b, the isolation structures 202a-202d, the second region 206b, and the third region 206c. In some exemplary examples, the conductive layer 246 is formed from polysilicon, and is formed by using a deposition method, such as a chemical vapor deposition method.

Then, referring to FIG. 1J again, a hard mask layer 248 is formed on first portions 246a of the conductive layer 246, in which the first portions 246a of the conductive layer 246 are located on the second region 206b and the third region 206c. In some exemplary examples, the hard mask layer 248 is blanketly formed on the conductive layer 246, and then a portion of the hard mask layer 248 which is located on the first region 206a and on the second stacked structure 227b is removed by using, for example, a photolithography process and an etching process.

As shown in FIG. 1K, an etching back process is performed on the conductive layer 246 to remove a second portion 246b of the conductive layer 246 and a portion of the gate oxide layer 244, so as to planarize the conductive layer 246. The second portion 246b of the conductive layer 246 is located over the first device structure 240a, the second device structure 240b, and the second stacked structure 227b. The portion of the gate oxide layer 244 is located on the first device structure 240a, the second device structure 240b, and the second stacked structure 227b. The etching back process may stop on the remaining portions 224a and 224b of the oxide layer 224. For example, the etching back process may be performed by using a dry etch technique. The etching back process may remove portions of the spacers 232. Then, the hard mask layer 248 is removed.

As shown in FIG. 1L, portions of the remaining conductive layer 246 are removed to expose the gate oxide layer 244 by using a photolithography method and an etching method, so as to form the first word line 249, the second word line 250, the gate 252 of the logic device 264, and the gate 254 of the high voltage device 266. The first word line 249 is located on the gate oxide layer 244 over the first word line well 228 and is adjacent to the first spacer 232 on the sidewall of the first device structure 240a. The second word line 250 is located on the gate oxide layer 244 over the second word line well 230 and is adjacent to the first spacer 232 on the sidewall of the second device structure 240b. The gate 252 of the logic device 264 is located on the gate oxide layer 244 over the logic well 210. The gate 254 of the high voltage device 266 is located on the gate oxide layers 244, 242, and 238 over the high voltage well 212. In removing the portions of the conductive layer 246, a portion of the gate oxide layer 244 on the sidewalls of the second stacked structure 227b, the remaining portion 224b of the oxide layer 224, and the remaining portion 222b of the nitride layer 222 are removed.

In some examples, as shown in FIG. 1M, lightly doped drains 256a and 256b are formed in the logic well 210, a lightly doped drain 256c is formed in the first word line well 228, a lightly doped drain 256d is formed in the cell well 208 between the first device structure 240a and the second device structure 240b, a lightly doped drain 256e is formed in the second word line well 230, and lightly doped drains 256f and 256g are formed in the high voltage well 212 by using, for example, an implantation method. In some examples, the lightly doped drain 256d is formed optionally.

Referring to FIG. 1M again, various second spacers 258 are respectively formed on sidewalls of the gate 252 of the logic device 264, sidewalls of the gate 254 the high voltage device 266, the sidewalls of the first device structure 240a, and the sidewalls of the second device structure 240b. In some exemplary examples, in forming the second spacers 258, a spacer material layer is blanketly formed to cover the first device structure 240, the second device structure 240b, the second stacked structure 227b, the gate 252, the gate 254, the first word line 249, the second word line 250, the gate oxide 244, and the substrate 200. The spacer material layer is etched to remove a portion of the spacer material layer, so as to form the second spacers 258. The spacer material layer may be formed by a deposition method, such as a chemical vapor deposition method. Etching the spacer material layer may be performed by using an anisotropic etching method. The spacer material layer may be formed to include an oxide layer and a nitride layer stacked on the oxide layer.

In some examples, as shown in FIG. 1N, a first contact hole 267a and a second contact hole 267b are respectively formed in the first device structure 240a and the second device structure 240b by using a photolithography method and an etching method. Forming the first contact hole 267a and the second contact hole 267b is performed to remove a portions of each of the remaining portions 224a of the oxide layer 224 and a portion of each of the remaining portion 222a of the nitride layer 222, so as to expose a portion of each of the remaining portion 220a of the control gate layer 220.

Referring to FIG. 1N again, various source/drain regions 260a-260g are respectively formed in the lightly doped drains 256a-256g by performing N+ or P+ S/D implantation processes. Then, various silicide layers 262a-262k are on the source/drain regions 260a-260g, the remaining portions 220a of the control gate layer 220 in the first device structure 240a and the second device structure 240b, and the gate 262 of the logic device 264, and the gate 254 the high voltage device 266, such that a semiconductor device 268 is substantially completed.

According to some embodiments of the present disclosure, a semiconductor device includes a semiconductor substrate and a pair of memory device structures. The semiconductor substrate includes a common source/drain region and a pair of individual source/drain regions, in which the common source/drain region is between the individual source/drain regions. The memory device structures each corresponds to one of the individual source/drain regions. Each memory device structure includes a trap storage structure, a control gate, a cap structure, and a word line. The trap storage structure is between the common source/drain region and the corresponding individual source/drain region. The control gate is over the trap storage structure. The cap structure is over the control gate, in which the cap structure comprises a nitride layer over the control gate and an oxide layer over the nitride layer. The word line is over the semiconductor substrate and laterally spaced from the control gate.

According to some embodiments of the present disclosure, a semiconductor device includes a semiconductor substrate, a memory device, a logic device, a high voltage device, a first isolation structure, a second isolation structure, and a stacked structure. The memory device is over the semiconductor substrate. The logic device is over the semiconductor substrate. The high voltage device is over the semiconductor substrate. The first isolation structure is in the semiconductor substrate and between the memory device and the logic device. The second isolation structure is in the semiconductor substrate and between and immediately adjacent to the memory device and the high voltage device. The stacked structure is over the first isolation structure and includes a first oxide layer over the isolation structure, a second oxide layer over the first oxide layer, and a nitride layer between the first oxide layer and the second oxide layer, in which the second isolation structure is free from coverage by the stacked structure.

According to some embodiments of the present disclosure, a semiconductor device includes a semiconductor substrate, a memory device, a logic device, a high voltage device, a first isolation structure, a second isolation structure, and a control gate layer. The memory device is over the semiconductor substrate and includes a control gate. The logic device is over the semiconductor substrate. The high voltage device is over the semiconductor substrate. The first isolation structure is in the semiconductor substrate and between the memory device and the logic device. The second isolation structure is in the semiconductor substrate and between and immediately adjacent to the memory device and the high voltage device. The control gate layer is over the first isolation structure, in which the control gate layer and the control gate of the memory device are made of the same material, and the second isolation structure is free from coverage by the control gate layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a first isolation structure and a second isolation structure in the semiconductor substrate;
   a pair of memory device structures between the first isolation structure and the second isolation structure and each comprising:
   a trap storage structure;
   a control gate over the trap storage structure;
   a cap structure over the control gate, wherein the cap structure comprises a nitride layer over the control gate and an oxide layer over the nitride layer; and
   a word line over the semiconductor substrate and laterally spaced from the control gate;
   a control gate layer directly over the first isolation structure, wherein the control gate layer and the control gate of each of the memory device structures are made of the same material, and the second isolation structure is free from coverage by the control gate layer; and a high voltage device comprising source and drain regions in the semiconductor substrate and a gate stack over the semiconductor substrate, between the source and drain regions, and comprising at least one gate dielectric layer over the semiconductor substrate and a gate over the at least one gate dielectric layer, wherein a top of the gate of the gate stack of the high voltage device is higher than a top of the control gate layer.

2. The semiconductor device of claim 1, wherein the trap storage structure comprises a first oxide layer over the semiconductor substrate, a second oxide layer over the first oxide layer of the trap storage structure, and a nitride layer between the first oxide layer of the trap storage structure and the second oxide layer of the trap storage structure.

3. The semiconductor device of claim 1, wherein the control gate is in contact with the trap storage structure.

4. The semiconductor device of claim 1, wherein each of the memory device structures further comprises a spacer disposed between the word line and the control gate.

5. The semiconductor device of claim 1, wherein each of the memory device structures further comprises a silicide layer over the control gate.

6. The semiconductor device of claim 5, wherein at least a portion of a top surface of the silicide layer is free from coverage by the cap structure.

7. The semiconductor device of claim 1, further comprising:
a logic device comprising source and drain regions in the semiconductor substrate and a gate stack over the semiconductor substrate, between the source and drain regions of the logic device, and comprising a gate dielectric layer over the semiconductor substrate and a gate over the gate dielectric layer of the gate stack of the logic device, wherein a top of the gate of the gate stack of the logic device is higher than the top of the control gate layer.

8. The semiconductor device of claim 1, further comprising:
a logic device comprising source and drain regions in the semiconductor substrate and a gate stack over the semiconductor substrate, between the source and drain regions of the logic device, and comprising a gate dielectric layer over the semiconductor substrate and a gate over the gate dielectric layer of the gate stack of the logic device, wherein a top of the gate of the gate stack of the logic device is higher than a top of the control gate of each of the memory device structures.

9. The semiconductor device of claim 8, wherein the pair of memory device structures comprises first and second memory device structures, the first isolation structure is between the logic device and the first memory device structure, and the second isolation structure is between the high voltage device and the second memory device structure.

10. A semiconductor device, comprising:
a semiconductor substrate;
a pair of memory devices over the semiconductor substrate, each of the memory devices comprising a control gate;
a logic device comprising source and drain regions in the semiconductor substrate and a gate stack over the semiconductor substrate and between the source and drain regions;
a high voltage device over the semiconductor substrate;
a first isolation structure in the semiconductor substrate and between one of the memory devices and the logic device;
a second isolation structure in the semiconductor substrate and between and immediately adjacent to the other one of the memory devices and the high voltage device; and
a control gate layer directly over the first isolation structure, wherein the second isolation structure is free from coverage by the control gate layer, and the control gate layer and the control gate of each of the memory devices are made of the same material.

11. The semiconductor device of claim 10, wherein each of the memory devices comprises:
a trap storage structure over the semiconductor substrate;
the control gate over the trap storage structure; and
a cap structure over the control gate.

12. The semiconductor device of claim 11, wherein the trap storage structure comprises a first oxide layer over the semiconductor substrate, a nitride layer over the first oxide layer of the trap storage structure, and a second oxide layer over the nitride layer of the trap storage structure.

13. The semiconductor device of claim 10, wherein the high voltage device comprises source and drain regions in the semiconductor substrate and a gate stack over the semiconductor substrate, between the source and drain regions of the high voltage device, and comprising at least one gate dielectric layer over the semiconductor substrate and a gate over the at least one gate dielectric layer of the gate stack of the high voltage device, wherein a top of the gate of the gate stack of the high voltage device is higher than a top of the control gate layer.

14. The semiconductor device of claim 10, wherein the high voltage device comprises source and drain regions in the semiconductor substrate and a gate stack over the semiconductor substrate, between the source and drain regions of the high voltage device, and comprising at least one gate dielectric layer over the semiconductor substrate and a gate over the at least one gate dielectric layer of the gate stack of the high voltage device, wherein a top of the gate of the gate stack of the high voltage device is higher than a top of the control gate of each of the memory devices.

15. A semiconductor device, comprising:
a semiconductor substrate;
a memory device over the semiconductor substrate and comprising a control gate;
a logic device over the semiconductor substrate;
a high voltage device over the semiconductor substrate;
a first isolation structure in the semiconductor substrate and between the memory device and the logic device;
a second isolation structure in the semiconductor substrate and between and immediately adjacent to the memory device and the high voltage device; and
a control gate layer, wherein an entirety of the control gate layer is directly over the first isolation structure, the control gate layer and the control gate of the memory device are made of the same material, and the second isolation structure is free from coverage by the control gate layer.

16. The semiconductor device of claim 15, wherein the memory device comprises a cap structure over the control gate.

17. The semiconductor device of claim 16, wherein the cap structure comprises a nitride layer over the control gate and an oxide layer over the nitride layer.

18. The semiconductor device of claim 15, wherein the memory device comprises a trap storage structure between the semiconductor substrate and the control gate, and the trap storage structure comprises a first oxide layer over the semiconductor substrate, a second oxide layer over the first oxide layer, and a nitride layer between the first oxide layer and the second oxide layer.

19. The semiconductor device of claim 15, further comprising:
   an oxide layer over a sidewall of the control gate layer facing the logic device.

20. The semiconductor device of claim 19, further comprising:
   a spacer over a sidewall of the oxide layer facing the logic device.

* * * * *